United States Patent
Yoscovits et al.

(10) Patent No.: US 10,763,420 B2
(45) Date of Patent: Sep. 1, 2020

(54) JOSEPHSON JUNCTION DAMASCENE FABRICATION

(71) Applicant: Intel Corporation, Santa Clara, CA (US)

(72) Inventors: Zachary R. Yoscovits, Beaverton, OR (US); David J. Michalak, Portland, OR (US); Jeanette M. Roberts, North Plains, OR (US); Ravi Pillarisetty, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/301,498

(22) PCT Filed: Jun. 13, 2016

(86) PCT No.: PCT/US2016/037134
§ 371 (c)(1),
(2) Date: Nov. 14, 2018

(87) PCT Pub. No.: WO2017/217960
PCT Pub. Date: Dec. 21, 2017

(65) Prior Publication Data
US 2019/0296214 A1 Sep. 26, 2019

(51) Int. Cl.
*H01L 39/24* (2006.01)
*H01L 27/18* (2006.01)
(Continued)

(52) U.S. Cl.
CPC .......... *H01L 39/2493* (2013.01); *H01L 27/18* (2013.01); *H01L 39/025* (2013.01);
(Continued)

(58) Field of Classification Search
None
See application file for complete search history.

(56) References Cited

U.S. PATENT DOCUMENTS

| 4,437,227 A | 3/1984 | Flannery et al. |
| 5,055,158 A | 10/1991 | Gallagher et al. |

(Continued)

FOREIGN PATENT DOCUMENTS

| WO | 2017217960 | 12/2017 |
| WO | 2017217961 | 12/2017 |

OTHER PUBLICATIONS

PCT/US2016/037135, Jun. 13, 2016, Josephson Junctions Made From Refractory Metals.
(Continued)

*Primary Examiner* — Steven B Gauthier
(74) *Attorney, Agent, or Firm* — Patent Capital Group

(57) ABSTRACT

Described herein are structures that include Josephson Junctions (JJs) to be used in superconducting qubits of quantum circuits disposed on a substrate. The JJs of these structures are fabricated using an approach that can be efficiently used in large scale manufacturing, providing a substantial improvement with respect to conventional approaches which include fabrications steps which are not manufacturable. In one aspect of the present disclosure, the proposed approach includes providing a patterned superconductor layer over a substrate, providing a layer of surrounding dielectric over the patterned superconductor layer, and providing a via opening in the layer of surrounding dielectric over a first portion of the patterned superconductor layer. The proposed approach further includes depositing in the via opening a first superconductor, a barrier dielectric, and a second superconductor to form, respectively, a base electrode, a tunnel barrier layer, and a top electrode of the JJ.

16 Claims, 11 Drawing Sheets

(51) Int. Cl.
*H01L 39/02* (2006.01)
*H01L 39/22* (2006.01)
*H01L 39/12* (2006.01)
*H01L 39/08* (2006.01)

(52) U.S. Cl.
CPC .............. *H01L 39/08* (2013.01); *H01L 39/12* (2013.01); *H01L 39/223* (2013.01); *H01L 39/24* (2013.01)

(56) References Cited

U.S. PATENT DOCUMENTS

| | | | |
|---|---|---|---|
| 5,739,084 | A | 4/1998 | Nakamura et al. |
| 6,885,435 | B2 | 4/2005 | Galburt |
| 8,437,818 | B1* | 5/2013 | Tolpygo ................ H01L 27/18 505/190 |
| 9,130,116 | B1* | 9/2015 | Tolpygo ................ H01L 27/18 |
| 10,467,544 | B2 | 11/2019 | Filipp et al. |
| 2004/0173787 | A1 | 9/2004 | Blais et al. |
| 2010/0022396 | A1 | 1/2010 | Otto et al. |
| 2010/0182039 | A1 | 7/2010 | Baumgardner et al. |
| 2011/0175061 | A1 | 7/2011 | Berkley et al. |
| 2011/0287944 | A1 | 11/2011 | Folk et al. |
| 2014/0235450 | A1* | 8/2014 | Chow .................... H01L 39/00 505/170 |
| 2014/0264285 | A1 | 9/2014 | Chow et al. |
| 2014/0315723 | A1 | 10/2014 | Moyerman et al. |
| 2014/0357493 | A1 | 12/2014 | Shea et al. |
| 2015/0187840 | A1 | 7/2015 | Ladizinsky et al. |
| 2015/0236235 | A1 | 8/2015 | Ladizinsky et al. |
| 2015/0380632 | A1 | 12/2015 | Tolpygo |
| 2016/0093790 | A1 | 3/2016 | Rigetti et al. |
| 2016/0148112 | A1 | 5/2016 | Kwon |
| 2017/0019388 | A1 | 1/2017 | Kamble et al. |
| 2017/0133576 | A1 | 5/2017 | Marcus et al. |
| 2019/0296214 | A1 | 9/2019 | Yoscovits et al. |
| 2019/0363239 | A1 | 11/2019 | Yoscovits et al. |

OTHER PUBLICATIONS

PCT/US2016/037133, Jun. 13, 2016, Floating Josephson Junction.
PCT/US2016/045941, Aug. 8, 2016, Method of Forming a High Performance and High Uniformity Josephson Junction.
PCT/US2016/065041, Dec. 6, 2016, Josephson Junction Constriction by Thinning.
PCT/US2017/065932, Dec. 13, 2017, JJ Created using Air Bridge.
Kim, et al., "Effects of annealing on the microstructures and mechanical properties of TiN/A1N nano-multilayer films prepared by ion-beam assisted deposition," Surface & Coatings Technology 153 (2002) 79-83.
Madan, et al., "Stabilization of Cubic A1N in Epitaxial A1N/TiN Superlattics", Physical Review Letters, vol. 78, No. 9, Mar. 3, 1997, pp. 1743-1746.
Setoyama, et al "Thermal stability of TiN/A1N superlattices", Thin Solid Films 341 (1999) 126-131.
Talyansky et al., "Fabrication and characterization of epitaxial A1N/TiN bilayers on sapphire", Thin Solid Films 323 (1998) 37-41.
"Independent, extensible control of same-frequency superconducting qubits by selective broadcasting," Asaad et al., Netherlands Organisation for Applied Scientific Research, Aug. 28, 2015, 17 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Surface loss simulations of superconducting coplanar waveguide resonators," Wenner et al, Applied Physics Letters 99, 113513 (2011), pp. 113513-1 through 3.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Scalable quantum circuit and control for a superconducting surface code," Versluis et al, Netherlands Organisation for Applied Scientific Research, Dec. 28, 2016, 9 pages.
"Suspending superconducting qubits by silicon micromachining," Chu et al., Department of Applied Physics, Yale University, Jun. 10, 2016, 10 pages.
International Search Report and Written Opinion issued in PCT Application No. PCT/US2016/037134 dated Feb. 28, 2017; 12 pages.
International Search Report and Written Opinion issued in PCT Application No. PCT/US2016/037135 dated Mar. 31, 2017; 13 pages.
Non Final Office Action in U.S. Appl. No. 16/097,677 dated Dec. 11, 2019, 15 pages.
Final Office Action in U.S. Appl. No. 16/097,677 dated Apr. 9, 2020, 21 pages.

\* cited by examiner

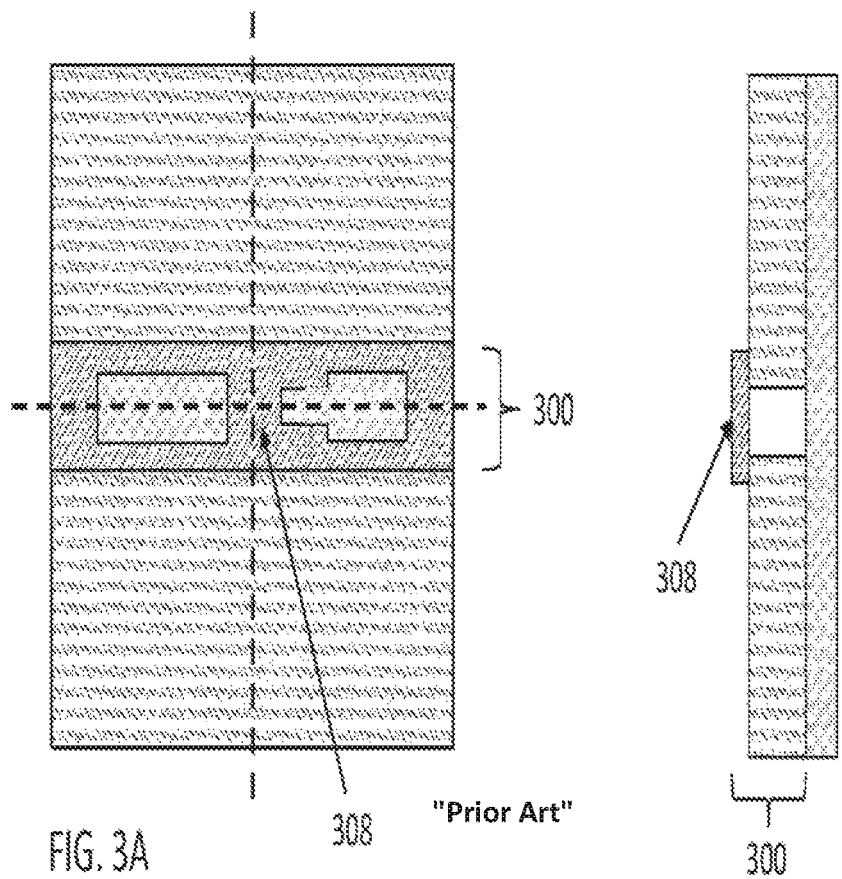
FIG. 3A "Prior Art"
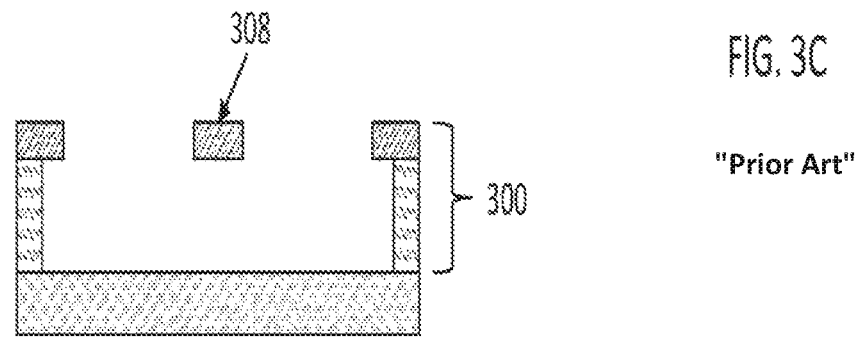
FIG. 3B
FIG. 3C "Prior Art"
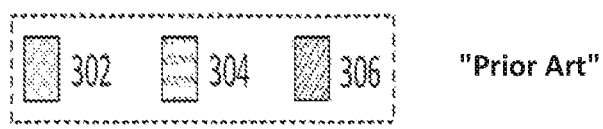
"Prior Art"

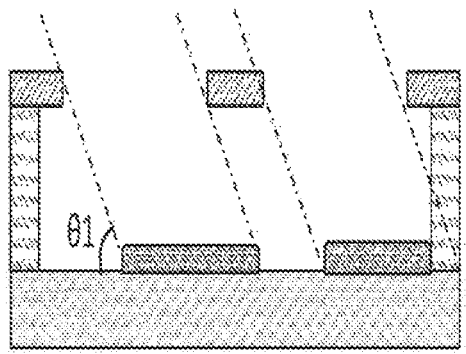
FIG. 4A
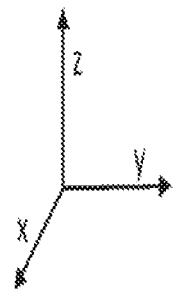
"Prior Art"
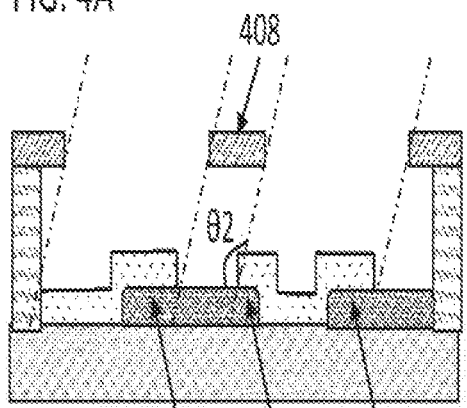
FIG. 4B  416  414  416
"Prior Art"
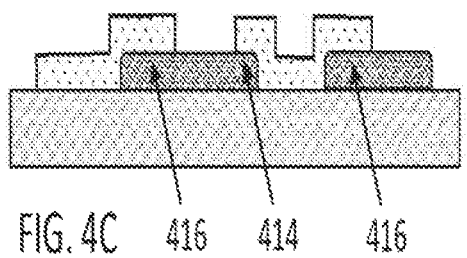
FIG. 4C  416  414  416
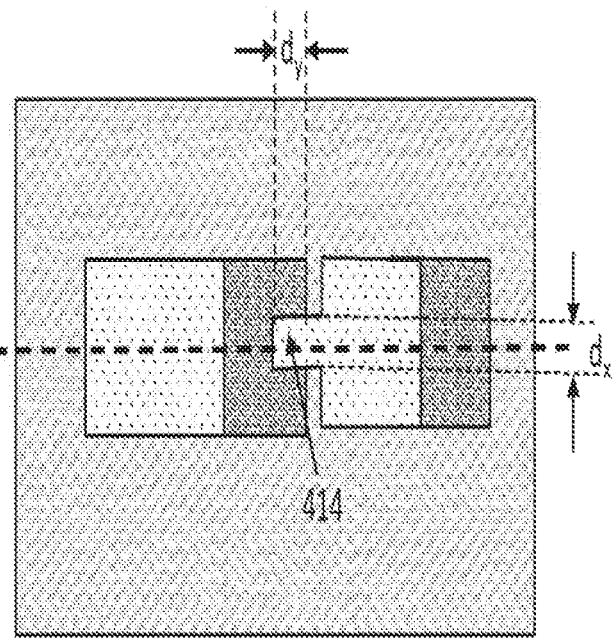
"Prior Art"

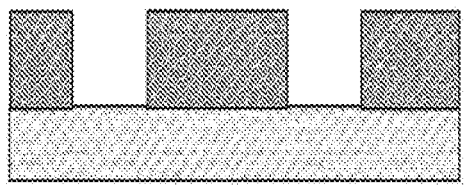
FIG. 5A
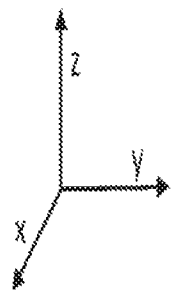
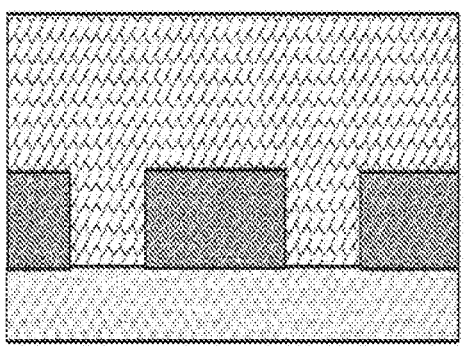
FIG. 5B
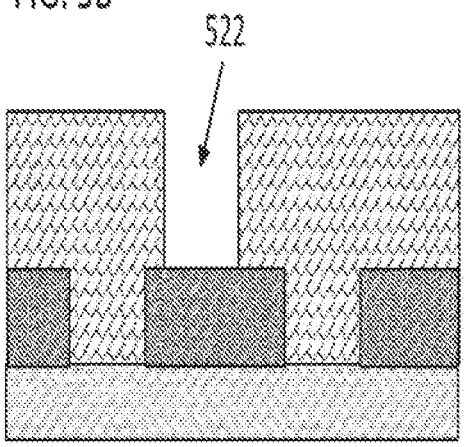
FIG. 5C
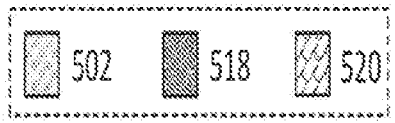

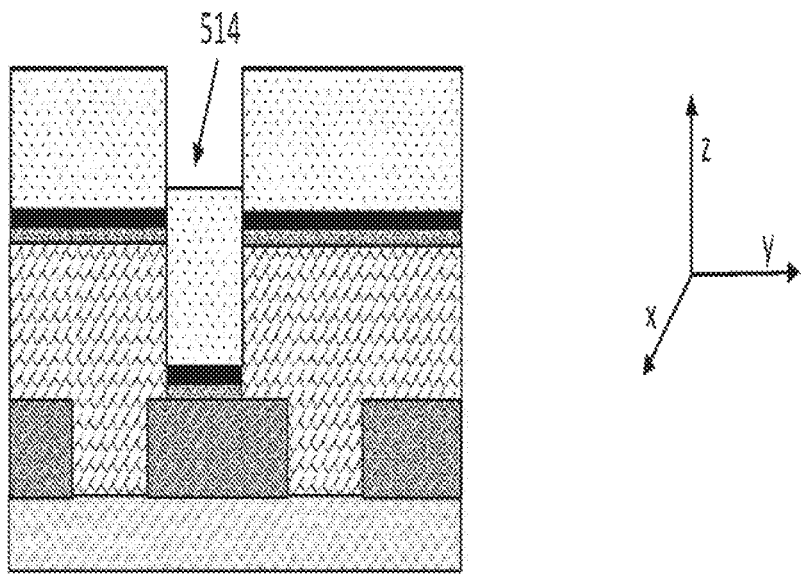
FIG. 5D
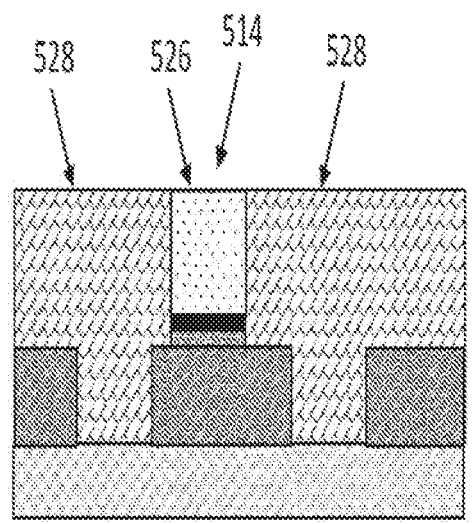
FIG. 5E
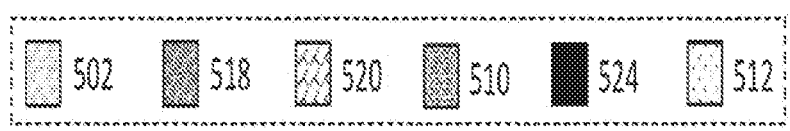

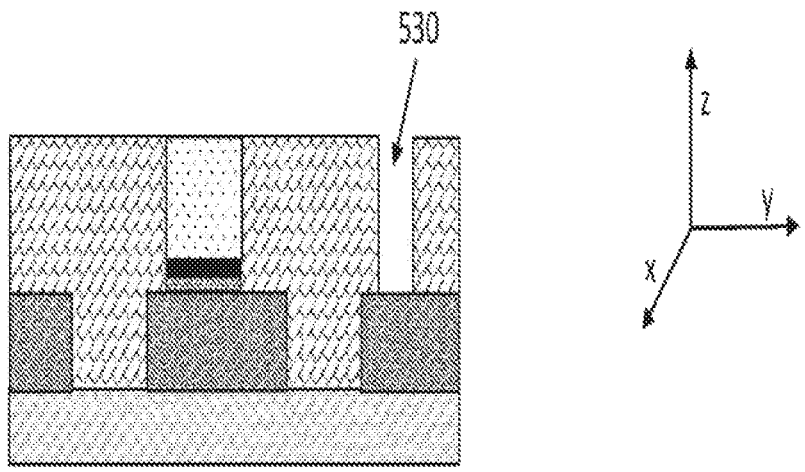
FIG. 5F
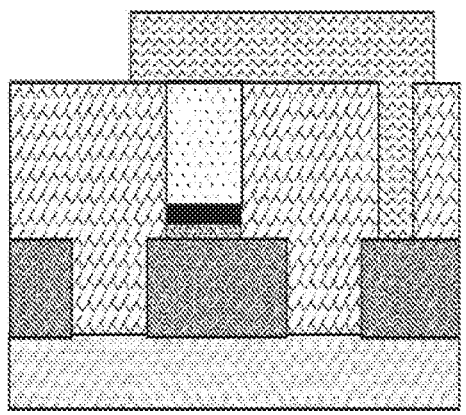
FIG. 5G
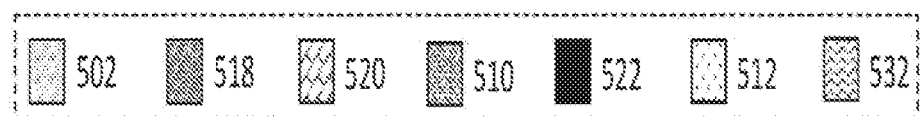

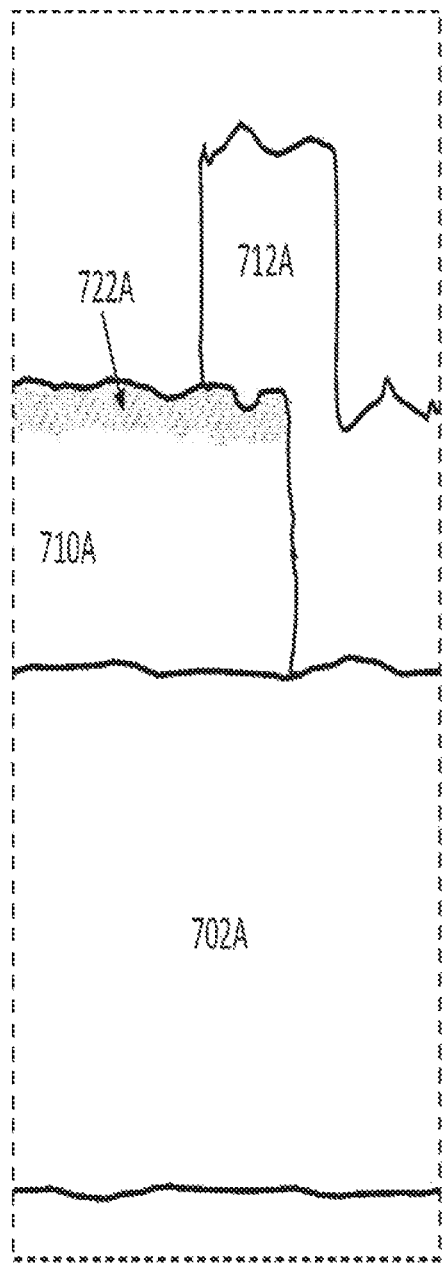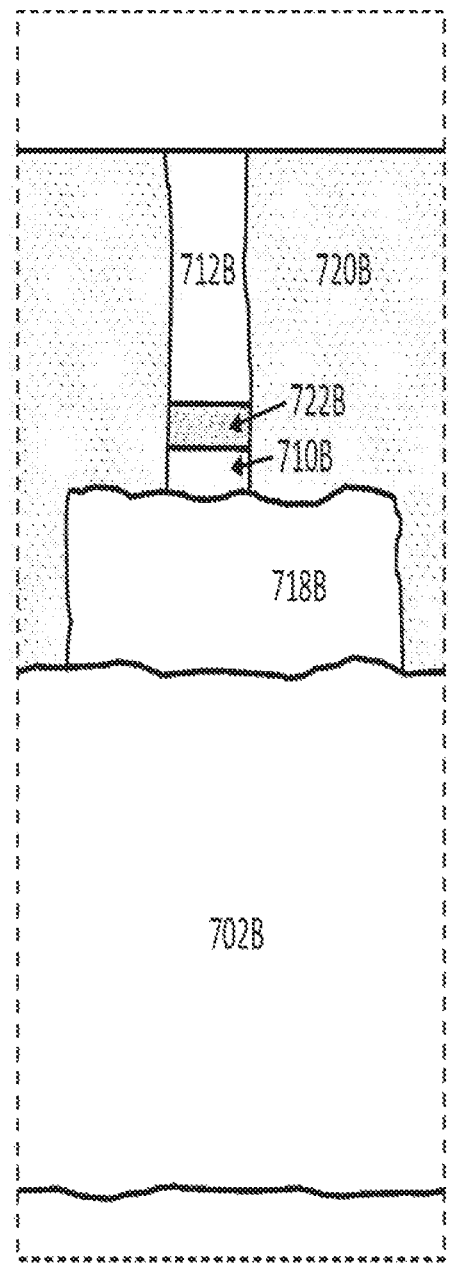
FIG. 7A  "Prior Art"   FIG. 7B

JOSEPHSON JUNCTION DAMASCENE FABRICATION

TECHNICAL FIELD

This disclosure relates generally to the field of quantum computing, and more specifically, to Josephson Junctions for use in quantum circuits and to methods of fabricating thereof.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 3A-3C provide a schematic illustration of photoresist masks provided over a substrate for fabricating Josephson Junctions using a double-angle shadow evaporation approach, according to some embodiments of the present disclosure.

FIGS. 4A-4C provide a schematic illustration of fabricating Josephson Junctions using a conventional double-angle shadow evaporation approach.

FIGS. 5A-5G provide a schematic illustration of Damascene fabrication of Josephson Junctions, according to some embodiments of the present disclosure.

FIGS. 7A-7B provide a schematic illustration of a Josephson Junction fabricated using the Damascene method described herein, according to some embodiments of the present disclosure.

DETAILED DESCRIPTION

Figure 1A:
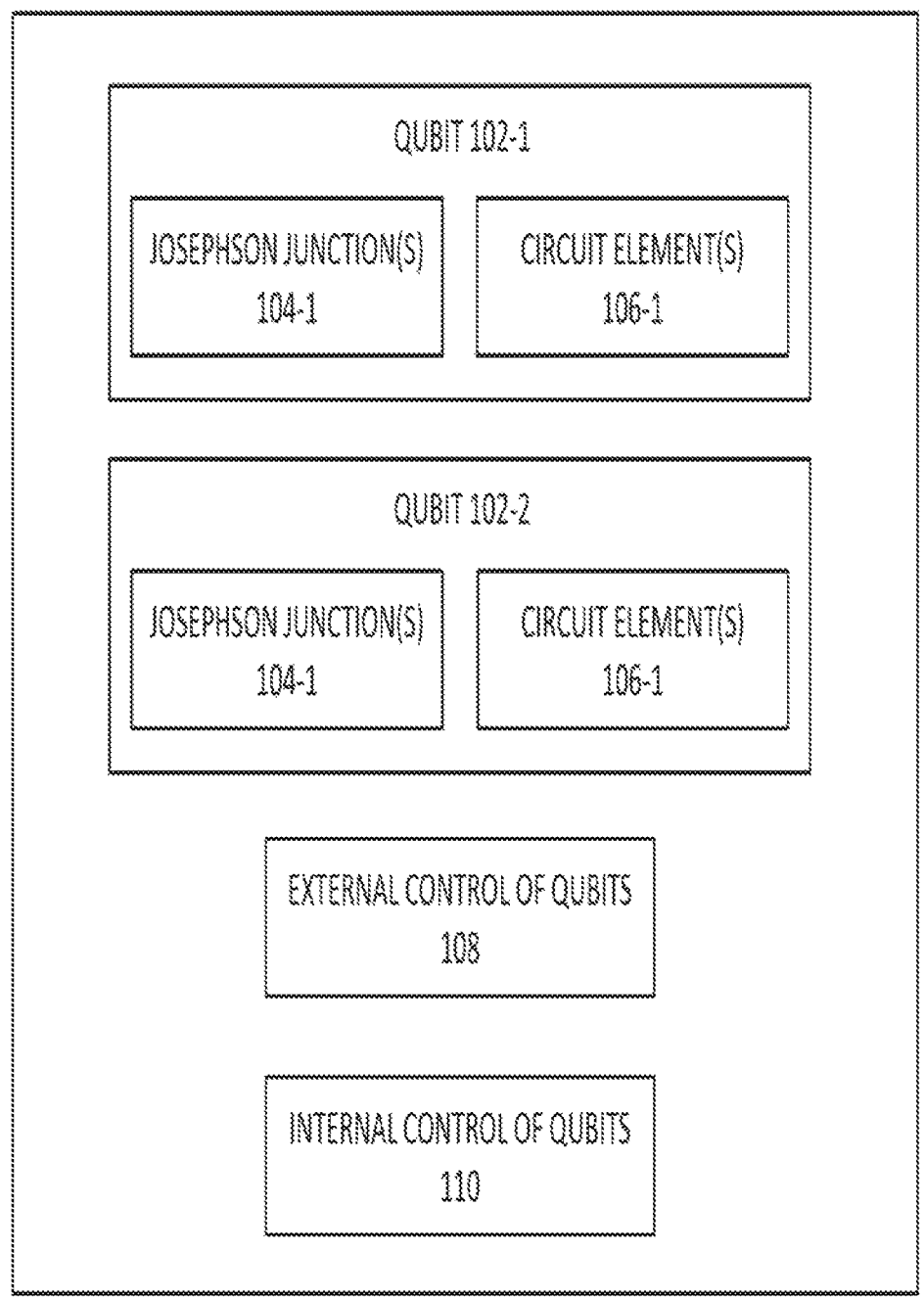
FIG. 1A provides a schematic illustration of a superconducting quantum circuit, according to some embodiments of the present disclosure.

As previously described herein, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Classical computers encode data into binary values, commonly referred to as bits. At any given time, a bit is always in only one of two states—it is either 0 or 1. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being about 10. One of the main challenges resides in protecting qubits from decoherence so that they can stay in their information-holding states long enough to perform the necessary calculations and read out the results. For this reason, materials, structures, and fabrication methods used for building qubits should continuously focus on reducing spurious (i.e. unintentional and undesirable) two-level systems (TLS's), thought to be the dominant source of qubit decoherence. In general, as used in quantum mechanics, a two-level (also referred to as "two-state") system is a system that can exist in any quantum superposition of two independent and physically distinguishable quantum states. Also for the reason of protection from decoherence, qubits are often operated at cryogenic temperatures, typically just a few degrees or even just a few millidegrees above absolute zero because cryogenic temperatures minimize the detrimental effects of spurious TLS's. None of these challenges ever had to be addressed for classical computers.

As the foregoing illustrates, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting qubits, single trapped ion qubits, Silicon (Si) quantum dot qubits, photon polarization qubits, etc.

Out of the various physical implementations of qubits listed above, superconducting qubits are promising candidates for building a quantum computer.

All of superconducting qubits operate based on the Josephson effect, which refers to a macroscopic quantum phenomenon of supercurrent, i.e. a current that, due to zero electrical resistance, flows indefinitely long without any voltage applied, across a device known as a Josephson Junction. Josephson Junctions are integral building blocks in superconducting quantum circuits where they form the basis of quantum circuit elements that can approximate functionality of theoretically designed qubits. Therefore, improvements with respect to fabricating Josephson Junctions for use in superconducting qubits are always desirable. In particular, it would be desirable to have methods for fabricating Josephson Junctions that can be efficiently used in large scale manufacturing.

As the foregoing description illustrates, building a quantum computer presents unique challenges not encountered in classical computing. The challenges are unique due to, both, the physics of data manipulation being different from that of classical computers (e.g. superposition, entanglement, and collapse), and the physical systems suitable to build quantum circuits of a quantum computer being different (e.g. the systems should be able to provide substantially lossless connectivity and be able to operate at cryogenic temperatures). Described herein are structures that include Josephson Junctions to be used in quantum circuit components, and methods for fabricating such structures.

Described herein are structures that include Josephson Junctions (JJs) to be used in superconducting qubits of quantum circuits disposed on a substrate. The JJs of these structures are fabricated using an approach that can be efficiently used in large scale manufacturing, providing a substantial improvement with respect to conventional approaches, such as e.g. double-angle shadow evaporation approach, which include fabrications steps which are not manufacturable at the larger wafer sizes used by leading edge device manufactures. In one aspect of the present disclosure, the proposed approach includes providing a patterned superconductor layer over a substrate, providing a layer of surrounding dielectric over the patterned superconductor layer, and providing a via opening in the layer of surrounding dielectric over a first portion of the patterned superconductor layer. The proposed approach further includes depositing in the via opening a first superconductor, a barrier dielectric, and a second superconductor to form, respectively, a base electrode, a tunnel barrier layer, and a top electrode of the JJ. Such an approach is referred to in the following as a "Damascene fabrication" approach to highlight the fact that it involves an additive process for creating features, as opposed to subtractive patterning commonly used in quantum computing community.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Furthermore, in the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation. Operations described may be performed in a different order from the described embodiment(s). Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

As used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. One metric of interest may be the decay rate associated with these losses (e.g. losses either from TLS's or residual resistance), and as long as the decay rate associated with these mechanisms is not worse than needed in order to achieve a fault-tolerant quantum calculation, then the losses are deemed acceptable and the idealized terms (e.g. superconducting or lossless)–appropriate. Specific values associated with an acceptable decay are expected to change over time as fabrication precision will improve and as fault-tolerant schemes may become more tolerant of higher decay rates. An adapted version of this metric, as well as other metrics suitable for a particular application in determining whether certain behavior may be referred to using idealized terms, are within the scope of the present disclosure.

As previously briefly explained above, quantum computing refers to the use of quantum mechanical properties to perform calculations. Some of these properties include superposition and entanglement. Just as classical computers are composed of bits that can either be in a 1 or a 0 state, a quantum computer is composed of quantum bits (i.e., qubits) which have states of $|0\rangle$ and $|1\rangle$. Quantum mechanics allows for superpositions of the $|0\rangle$ and $|1\rangle$ states with a general form of $a|0\rangle+b|1\rangle$ where a and b are complex numbers. When a qubit state is measured, it collapses to either state $|0\rangle$ with a probability of that happening being $|a|^2$, or to state $|1\rangle$ with a probability of the latter being $|b|^2$. Taking into account the fact that $|a|^2+|b|^2=1$ (since the total probability must sum to unity) and ignoring an overall phase factor which does not have any observable effects, the general state can be re-written as $\cos\theta/2|0\rangle+e^{i\varphi}\sin\theta/2|1\rangle$, where $\varphi$ is the phase difference between the two states.

Entanglement occurs when the interaction between two particles (e.g. two qubits) is such that the states of the two cannot be specified independently, but rather can only be specified for the whole system. This causes the states of the two qubits to be linked together such that measurement of one of the qubits, causes the state of the other qubit to collapse.

In order to realize a quantum computer, a physical system that can act as a qubit is needed. Such a system needs to have at least two states to act as 0 and 1 states. Note that it is not necessary to have a system with exactly only two states if the spacing between each energy level is different, such that each level can be addressed individually. As previously described herein, one type of physical system that could be used to implement qubits is based on use of superconducting materials (superconducting qubits).

In some implementations, namely when superconducting qubits are implemented as transmon qubits, two basic elements of superconducting quantum circuits are inductors and capacitors. However, circuits made using only these two elements cannot make a system with two energy levels because, due to the even spacing between the system's energy levels, such circuits will produce harmonic oscillators with a ladder of equivalent states. A nonlinear element is needed to have an effective two-level quantum state system, or qubit. Josephson Junction is an example of such non-linear, non-dissipative circuit element.

Josephson Junctions may form the central circuit elements of a superconducting quantum computer. A Josephson Junction may include a thin layer of insulator, typically referred to as a barrier or a tunnel barrier, sandwiched between two layers of superconductor. The Josephson Junction acts as a superconducting tunnel junction. Cooper pairs tunnel across the barrier from one superconducting layer to the other. The electrical characteristics of this tunneling are governed by so-called Josephson relations which provide the basic equations governing the dynamics of the Josephson effect:

$$I = I_c \sin\varphi \quad (1)$$

$$V = \frac{\hbar}{2e}\dot\varphi \quad (2)$$

In these equations, $\varphi$ is the phase difference in the superconducting wave function across the junction, $I_c$ (the critical current) is the maximum current that can tunnel through the junction, which depends on the barrier thickness and the area of the junction, V is the voltage across the Josephson Junction, I is the current flowing through the Josephson Junction, $\hbar$ is the reduced Planck's constant, and e is electron's charge. Equations (1) and (2) can be combined to give an equation (3):

$$V = \frac{\hbar}{2eI_c\cos\varphi}\dot I \quad (3)$$

Equation (3) looks like the equation for an inductor with inductance L:

$$L = \frac{\hbar}{2eI_C\cos\varphi} \quad (4)$$

Since inductance is a function of $\varphi$, which itself is a function of I, the inductance of a Josephson Junction is non-linear, which makes an LC circuit formed using a Josephson Junction as the inductor have uneven spacing between its energy states.

The foregoing provides an illustration of using a Josephson Junction in a transmon, which is one type of superconducting qubit. In other classes of superconducting qubits, Josephson Junctions combined with other circuit elements have similar functionality of providing the non-linearity necessary for forming an effective two-level quantum state, or qubit. In other words, when implemented in combination with other circuit elements (e.g. capacitors in transmons or superconducting loops in flux qubits), one or more Josephson Junctions allow realizing a quantum circuit element which has uneven spacing between its energy levels resulting in a unique ground and excited state system for the qubit. This is illustrated in FIG. 1A, providing a schematic illustration of a superconducting quantum circuit 100, according to some embodiments of the present disclosure. As shown in FIG. 1A, an exemplary superconducting quantum circuit 100 includes two or more qubits 102 (reference numerals following after a dash, such as e.g. qubit 102-1 and 102-2 indicate different instances of the same or analogous element). Each of the superconducting qubits 102 may include one or more Josephson Junctions 104 connected to one or more other circuit elements 106, which, in combination with the Josephson Junction(s) 104, form a non-linear circuit providing a unique two-level quantum state for the qubit. The circuit elements 106 could be e.g. capacitors in transmons or superconducting loops in flux qubits.

As also shown in FIG. 1A, an exemplary superconducting quantum circuit 100 typically includes means 108 for providing external control of qubits 102 and means 110 for providing internal control of qubits 102. In this context, "external control" refers to controlling the qubits 102 from outside of, e.g., an integrated circuit (IC) chip comprising the qubits, including control by a user of a quantum computer, while "internal control" refers to controlling the qubits 102 within the IC chip. For example, if qubits 102 are transmon qubits, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 102, the external control means 108, and the external control means 110 of the quantum circuit 100 may be provided on, over, or at least partially embedded in a substrate (not shown in FIG. 1A). A substrate may include any substrate suitable for realizing quantum circuit components, as described above. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates include silicon-on-insulator (SOI) substrates, III-V substrates, and quartz substrates.

Figure 1B:
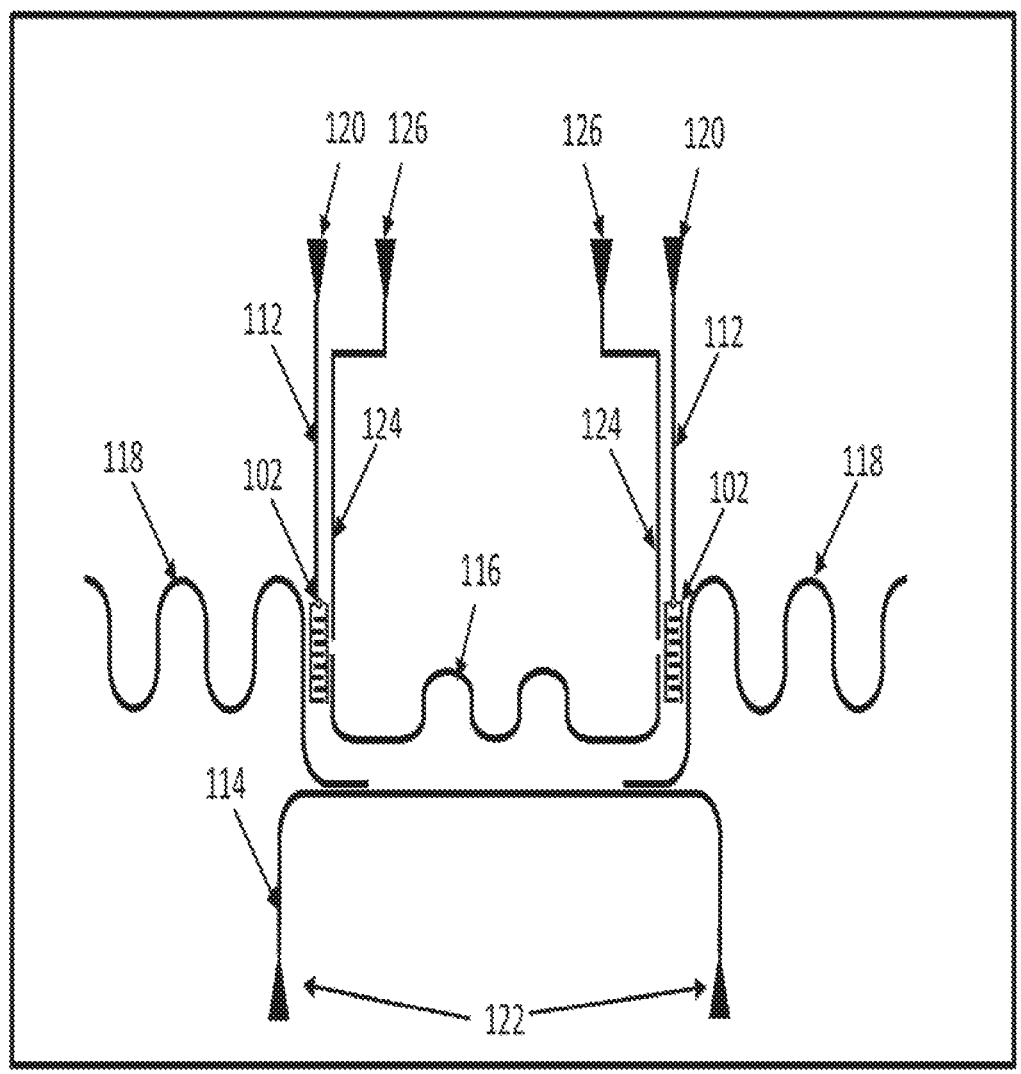
FIG. 1B provides a schematic illustration of an exemplary physical layout of a superconducting quantum circuit, according to some embodiments of the present disclosure.

As previously described herein, within superconducting qubit implementations, three classes are typically distinguished: charge qubits, flux qubits, and phase qubits. Transmons, a type of charge qubits with the name being an abbreviation of "transmission line shunted plasma oscillation qubits", are particularly encouraging because they exhibit reduced sensitivity to charge noise. FIG. 1B provides a schematic illustration of an exemplary physical layout of a superconducting quantum circuit 100B where qubits are implemented as transmons, according to some embodiments of the present disclosure.

Similar to FIG. 1A, FIG. 1B illustrates two qubits 102. In addition, FIG. 1B illustrates flux bias lines 112, microwave lines 114, a coupling resonator 116, a readout resonator 118, and wirebonding pads 120 and 122. The flux bias lines 112 and the microwave lines may be viewed as examples of the external control means 108 shown in FIG. 1A. The coupling resonator 116 and the readout resonator 118 may be viewed as examples of the internal control means 110 shown in FIG. 1A.

Running a current through the flux bias lines 112, provided from the wirebonding pads 120, allows tuning (i.e. changing) the frequency of the corresponding qubits 102 to which each line 112 is connected. In general, it operates in the following manner. As a result of running the current in a particular flux bias line 112, magnetic field is created around the line. If such a magnetic field is in sufficient proximity to the qubit 102, e.g. by a portion of the flux bias line 112 being provided next to the qubit 102, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=h\nu$, where E is the energy (in this case the energy difference between energy levels of a qubit), h is the Planck's constant and $\nu$ is the frequency (in this case the frequency of the qubit). As this equation illustrates, if E changes, then $\nu$ changes. Provided there is sufficient multiplexing, different currents can be sent down each of the flux lines allowing for independent tuning of the various qubits.

The state(s) of each qubit 102 may be read by way of its corresponding readout resonator 118. As explained below, the qubit 102 induces a resonant frequency in the readout resonator 118. This resonant frequency is then passed to the microwave lines 114 and communicated to the pads 122.

To that end, a readout resonator 118 may be provided for each qubit. The readout resonator 118 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 118 is coupled to the qubit by being in sufficient proximity to the qubit 102, more specifically in sufficient proximity to the capacitor of the qubit 102, when the qubit is implemented as a transmon, either through capacitive or inductive coupling. Due to a coupling between the readout resonator 118 and the qubit 102, changes in the state of the qubit 102 result in changes of the resonant frequency of the readout resonator 118. In turn, because the readout resonator 118 is in sufficient proximity to the microwave line 114, changes in the resonant frequency of the readout resonator 118 induce changes in the current in the microwave line 114, and that current can be read externally via the wirebonding pads 122.

The coupling resonator 116 allows coupling different qubits together in order to realize quantum logic gates. The coupling resonator 116 is similar to the readout resonator 118 in that it is a transmission line that includes capacitive connections to ground on both sides (i.e. a half wavelength resonator), which also results in oscillations within the coupling resonator 116. Each side of the coupling resonator 116 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 116 has coupling with a respective different qubit, the two qubits are coupled together through the coupling resonator 116. In this manner, state of one qubit depends on the state of the other qubit, and the other way around. Thus, coupling resonators may be employed in order to use a state of one qubit to control a state of another qubit.

In some implementations, the microwave line 114 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 114 shown in FIG. 1B may be used to only readout the state of the qubits as described above, while separate drive lines such as e.g. drive lines 124 shown in FIG. 1B, may be used to control the state of the qubits. In such implementations, the microwave lines used for readout may be referred to as readout lines (e.g. readout line 114), while microwave lines used for controlling the state of the qubits may be referred to as drive lines (e.g. drive lines 124). The drive lines 124 may control the state of their respective qubits 102 by providing, using e.g. wirebonding pads 126 as shown in FIG. 1B, a microwave pulse at the qubit frequency, which in turn stimulates (i.e. triggers) a transition between the 0 and 1 state of the qubit. By varying the length of this pulse, a partial transition can be stimulated, giving a superposition of the 0 and 1 states of the qubit.

Flux bias lines, microwave lines, coupling resonators, drive lines, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of superconducting quantum interference devices (SQUIDS) or connections between two ground lines of a particular transmission line for equalizing electrostatic potential on the two ground lines, are also referred to herein as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog to digital converters, mixers, multiplexers, amplifiers, etc.

In various embodiments, the interconnects as shown in FIG. 1B could have different shapes and layouts. For example, some interconnects may comprise more curves and turns while other interconnects may comprise less curves and turns, and some interconnects may comprise substantially straight lines. In some embodiments, various interconnects may intersect one another, in such a manner that they don't make an electrical connection, which can be done by using e.g. a bridge, bridging one interconnect over the other. As long as these interconnects operate in accordance with use of these interconnects as known in the art for which some exemplary principles were described above, quantum circuits with different shapes and layouts of the interconnects than those illustrated in FIG. 1B are all within the scope of the present disclosure.

Coupling resonators and readout resonators may be configured for capacitive coupling to other circuit elements at one or both ends in order to have resonant oscillations, whereas flux bias lines and microwave lines may be similar to conventional microwave transmission lines because there is no resonance in these lines. Each one of these interconnects may be implemented as a coplanar waveguide, which is one type of transmission line. A stripline is another type of transmission line. Typical materials to make the interconnects include aluminum (Al), niobium (Nb), niobium nitride (NbN), titanium nitride (TiN), and niobium titanium nitride (NbTiN), all of which are particular types of superconductors. However, in various embodiments, other suitable superconductors may be used as well.

As previously described herein, FIG. 1B illustrates an embodiment specific to transmons. Subject matter is not limited in this regard and may include other embodiments of quantum circuits implementing other types of superconducting qubits that would also utilize Josephson Junctions as described herein, all of which are within the scope of the present disclosure.

Figure 1C:
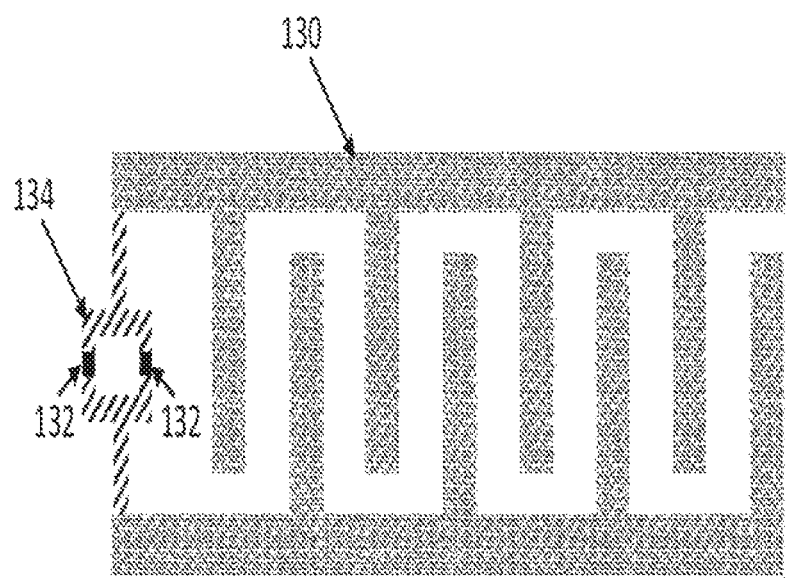
FIG. 1C provides a schematic illustration of an exemplary transmon, according to some embodiments of the present disclosure.

FIG. 1C illustrates an exemplary transmon 128 which could be used as any one of the qubits 102, according to some embodiments of the present disclosure. Presence of a capacitor 130 of such a size that capacitive energy is significantly larger than the Josephson energy in a qubit of FIG. 1C indicates that the qubit is a transmon. The capacitor 130 is configured to store energy in an electrical field as charges between the plates of the capacitor.

The capacitor 130 is depicted as an interdigitated capacitor, a particular shape of capacitor that provides a large capacitance with a small area, however, in various embodiments, other shapes and types of capacitors may be used as well. For example, such a capacitor could be implemented simply as two parallel plates with vacuum in between. Furthermore, in various embodiments, the capacitor 130 may be arranged in any direction with respect to the SQUID or a single Josephson Junction, not necessarily as shown in FIG. 1C.

In addition, the transmon illustrated in FIG. 1C includes two Josephson Junctions 132 incorporated into a superconducting loop 134. The two Josephson Junctions 132 and the superconducting loop 134 together form a superconducting quantum interference device (SQUID). Magnetic fields generated by the flux bias line 112 connected to the qubit extend to the SQUID (i.e. current in the flux bias line 112 create magnetic fields around the SQUID), which in turn tunes the frequency of the qubit.

In other embodiments, a SQUID could include only one Josephson Junction, or a transmon could be implemented with a single Josephson Junction without the superconducting loop. A single Josephson Junction without the SQUID is insensitive to magnetic fields, and thus, in such an implementation, flux bias lines 112 may not be used to control the frequency of the transmon.

While FIGS. 1A and 1B illustrate examples of quantum circuits comprising only two qubits 102, embodiments with any larger number of qubits are possible and are within the scope of the present disclosure. At least some of the one or more qubits 102 shown in FIGS. 1A-1C may comprise Josephson Junction structures fabricated using the Damascene fabrication approach as described herein.

Furthermore, while the present disclosure includes references to microwave signals, this is done only because current qubits are designed to work with such signals because the energy in the microwave range is higher than thermal excitations at the temperature that qubits are operated at. In addition, techniques for the control and measurement of microwaves are well known. For these reasons, typical frequencies of superconducting qubits are in 5-10 gigahertz (GHz) range, in order to be higher than thermal excitations, but low enough for ease of microwave engineering. However, advantageously, because excitation energy of superconducting qubits is controlled by the circuit elements, these qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

In various embodiments, quantum circuits such as the one shown in FIGS. 1A-1B may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the integrated circuit. The integrated circuit may be employed as part of a chipset for executing one or more related functions in a quantum system.

Figure 2:
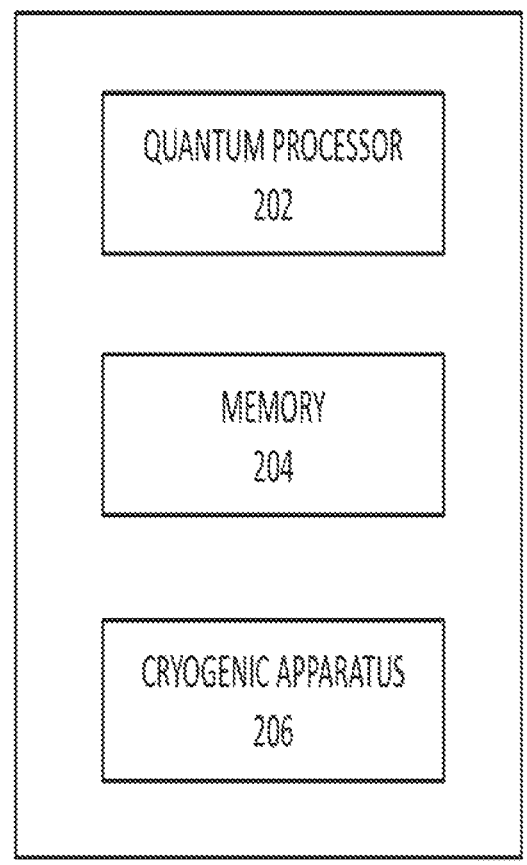
FIG. 2 provides a schematic illustration of quantum computing device, according to some embodiments of the present disclosure.

FIG. 2 provides an illustration of quantum computing device, e.g. a quantum computer, 200, according to some embodiments of the present disclosure. The computing device 200 may be any electronic device that processes quantum information. In some embodiments, the computing device 200 may include a number of components, including, but not limited to, a quantum processor 202, a memory 204, and a cryogenic apparatus 206, as shown in FIG. 2. Each of the quantum processor 202 and the memory 204 may include one or more quantum circuits comprising Josephson Junction structures fabricated using the Damascene fabrication approach as described herein, e.g. quantum circuits and Josephson Junctions as illustrated in FIGS. 1A-1C.

The processor 202 may be a universal quantum processor or a specialized quantum processor configured to run quantum simulations, or one or more of particular quantum algorithms. The term "processor" may refer to any device or portion of a device that processes electronic data from registers and/or memory to transform that electronic data into other electronic data that may be stored in registers and/or memory. In some embodiments, the processor 202 may be configured to execute algorithms that may be particularly suitable for quantum computers, such as e.g. cryptographic algorithms that utilize prime factorization, algorithms to optimize chemical reactions, or protein folding algorithms. The term "processor" may refer to any device or portion of a device that processes quantum information.

In various embodiments, the computing device 200 may include other components not shown in FIG. 2, such as e.g. one or more of a controller, I/O channels/devices, supplementary microwave control electronics, multiplexer, signal mixers, a user interface, as well as other quantum devices such as e.g. quantum amplifiers, quantum sensors, which quantum devices may also implement certain embodiments of the present disclosure.

In various embodiments, the computing device 200 may be included within a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other quantum electronic device that processes data by utilizing quantum mechanical phenomena.

In order to highlight the advantages offered by Josephson Junction structures fabricated using the Damascene process as proposed herein, it would be helpful to first explain how conventional Josephson Junctions are fabricated using a so-called double-angle shadow evaporation approach (also sometimes referred to as "double-angle shadow evaporation" or "hanging resist" approach). The name "double-angle shadow evaporation/evaporation" reflects the fact that the method involves metal deposition, typically carried out metal evaporation, at two different angles of incidence with respect to the substrate (hence, double-angle). The name further reflects the fact that metal deposition is performed through a hanging photoresist mask which casts a shadow on at least a part of the substrate, obscuring metal deposition on that part (hence, shadow evaporation/evaporation).

FIGS. 3A-3C provide a schematic illustration of one example of a photoresist mask 300 provided over a substrate 302 for fabricating Josephson Junctions using a double-angle shadow evaporation approach, according to some embodiments of the present disclosure. Each of FIGS. 3A-3C provides a view of the same photoresist mask 300 over the substrate 302, but perspectives of these views are different. FIG. 3A provides a top-down view (i.e. a view from a point above the substrate 302). FIG. 3B provides a cross-sectional view with a cross-section of the structure of FIG. 3A taken along a horizontal dashed line shown in FIG. 3A. Finally, FIG. 3C provides a cross-sectional view with a cross-section of the structure of FIG. 3A taken along a vertical dashed line shown in FIG. 3A. A legend provided within a dashed box at the bottom of FIGS. 3A-3C illustrates patterns used to indicate different elements shown in FIGS. 3A-3C, so that the FIGs are not cluttered by many reference numerals.

Josephson Junctions may be created by a double-angle shadow evaporation approach using a two-layer photoresist mask 300 that includes a bottom photoresist layer 304 and a top photoresist layer 306 as shown in FIGS. 3A-3C. The bottom layer 306 is undercut from the top layer 304 in that some portions of the top layer 304 hang, or are suspended, over the bottom layer 306. The bottom layer 306 is undercut in such a manner that the top layer 304 of photoresist forms a suspended bridge 308, known as a Dolan bridge, over a section of the substrate 302. Ways for fabricating such undercuts in photoresist are well-known in the art of photolithographic processing and, therefore, are not described here in detail.

In order to form a Josephson Junction, metals are then deposited through the photoresist mask 300 with the suspended bridge. Conventionally, this is done as illustrated in FIGS. 4A-4C.

Each of FIGS. 4A-4C illustrates a result of different subsequent fabrication steps. FIG. 4C provides two views of the same structure. The view on the right side of FIG. 4C is a top-down view (i.e. a view similar to that shown in FIG. 3A). The view on the left side of FIG. 4C is a cross-sectional view with a cross-section of the structure of FIG. 4C taken along a horizontal dashed line shown in FIG. 4C (i.e. a view similar to that shown in FIG. 3B). Each of FIGS. 4A and 4B only provide a cross-sectional view similar to that of the left side of FIG. 4C but at an earlier fabrication step. Similar to FIGS. 3A-3C, and also applicable to FIGS. 5A-5G described below, a legend provided within a dashed box at the bottom of FIGS. 4A-4C and at the bottom of FIGS. 5A-5G illustrates patterns used in the FIGs. to indicate different elements shown in FIGS. 4A-4C. Moreover, similar reference numerals in FIGS. 3A-3C, FIGS. 4A-4C, and FIGS. 5A-5G are used to illustrate analogous elements in the figures. For example, reference numerals 302, 402, and 502 shown, respectively, in FIGS. 3, 4, and 5 refer to a substrate, reference numerals 304 and 404—to a bottom mask layer, reference numerals 414 and 514—to a Josephson Junction, and so on. When provided with reference to one of the figures, discussions of these elements are applicable to other figures, unless stated otherwise. Thus, in the interests of brevity, discussions of similar elements are not repeated for each of the figures but, rather, the differences between the figures are described.

As previously described herein, a Josephson Junction comprises a thin layer of insulator sandwiched between two layers of superconductors, the insulating layer acting as the barrier in a superconducting tunnel junction. According to the double-angle shadow evaporation approach, such a device is fabricated by, first, depositing a layer of a first superconductor 410 on the substrate 402, as shown in FIG. 4A, through the two-layer mask such as e.g. the one shown in FIGS. 3A-3C. The first superconductor is deposited at an angle with respect to the substrate 402, as shown in FIG. 4A with an angle θ1. Slanted dotted-dashed lines in FIG. 4A illustrate the direction of deposition of the first superconductor 410. A layer of the first superconductor 410 may have a thickness between e.g. 10 and 300 nm, preferably between 40 and 100 nm.

The first superconductor 410 forms a base electrode of the future Josephson Junction. A layer of insulator is then provided over the first superconductor 410 to form a tunnel barrier of the future Josephson Junction. The tunnel barrier is formed by oxidizing the first superconductor 410, thus creating a layer of first superconductor oxide on its surface. Such an oxide may have a thickness between e.g. 1 and 5 nm, typically for qubit applications between 2 and 3 nm.

The fact that the choice of a tunnel barrier in a double-angle shadow evaporation method is constrained to an oxide of the base electrode superconductor limits the choice of the superconductor used as the first superconductor 410 in that the superconductor must be such that a controlled layer of oxide may be created on it. In practice, aluminum oxide is the only controlled oxide that may be formed from a metal. Therefore, currently aluminum is the only superconducting metal that is used for the base electrode of Josephson Junctions fabricated using the double-angle shadow evaporation technique.

The layer of insulator is not specifically shown in FIGS. 4A-4C. What is shown is that, after the layer of insulator is provided on the first superconductor 410, a second superconductor 412 is deposited through the mask but at a different angle with respect to the substrate 402 than θ1. FIG. 4B illustrates the second angle as an angle θ2 and slanted dotted-dashed lines in FIG. 4B illustrate the direction of deposition of the second superconductor 412. In some embodiments, the first and the second superconductors 410, 412 are deposited at the opposite angles, if measured with respect to a normal to the substrate 402. Conventionally, the second superconductor 420 is aluminum because the first superconductor must be aluminum, as described above. A layer of the second superconductor 412 may have a thickness between e.g. 10 and 300 nm, typically between 40 and 100 nm. The second superconductor 412 forms a counter electrode (i.e. counter to the base electrode formed by the first superconductor 410) of the future Josephson Junction.

The first and second superconductors 410, 412 are usually deposited using a non-conformal process, such as e.g. evaporative deposition. After deposition of the second superconductor 412, the deposition mask is removed, removing with it any first and/or second superconductor 410, 412 deposited on top of it.

In general, the above-described process of creating patterned structures of one or more target materials (in this case, structures made of the first and second superconductors 410, 412) on the surface of a substrate using a sacrificial material such as photoresist is referred to as a lift-off method. Lift-off is a type of an additive technique, as opposed to subtracting techniques like etching, and may be applied in cases where a direct etching of structural material would have undesirable effects on one or more layers below.

After the deposition mask is removed, the resulting Josephson Junction is left on the substrate 402 as shown in FIG. 4C as a Junction 414. The Junction 414 is formed by the small region of overlap under the photoresist bridge 408 (i.e. the area under the bridge 408 where the first superconductor 410, covered with a layer of a thin insulating material is overlapped by the second superconductor 412). Dimensions of the Junction 414 along x-axis and y-axis, shown in FIG. 4C as $d_x$ and $d_y$, respectively, are typically between 50 and 1000 nm for any of $d_x$ and $d_y$.

Furthermore, as a result of performing the double-angle shadow evaporation as described above, junctions of the first and second superconductors may also formed on each side of the Josephson Junction 414, such junctions shown in FIGS. 4B and 4C as Junctions 416. However, because these junctions are of much larger dimensions than the Josephson Junction 414, e.g. measured several thousands of nm in the x-direction and hundreds of nm or more in the y-direction, they are essentially infinite for the Josephson effect to take place and, therefore, act as superconductors rather than Josephson Junctions.

One problem with the fabrication approach described above is that it includes steps that are not manufacturable at the larger wafer sizes used in the semiconductor industry. For example, evaporation step does not produce a uniform film across the wafer and would prohibit uniform qubit performance across large area. Moreover, the fabrication approach described above relies on lift-off of metal films to produce wires remaining on the wafer. The lift-off technique is not amenable to the chemical waste systems of wafer cleaning tools and would not facilitate high volume manufacturing.

Embodiments of the present disclosure are based on an insight that fabricating Josephson Junctions using techniques similar to those employed in large scale manufacturing of conventional integrated circuits would allow for the ease of scalability of quantum circuits. However, directly applying conventional integrated circuit manufacturing techniques to fabricating quantum circuit components is not appropriate because, as previously described herein, building quantum circuits presents unique challenges not encountered in classical computing. Thus, embodiments of the present disclosure are further based on recognition that issues unique to quantum circuits have to be taken in consideration when evaluating applicability of conventional integrated circuit fabrications techniques to building quantum circuits, and, in particular, Josephson Junctions.

One such issue is e.g. presence of spurious TLS's. As described in the Background section, one major source of loss, and thus decoherence in superconducting qubits are spurious TLS's caused by defects in the areas surrounding Josephson Junctions and other quantum circuit elements such as e.g. capacitors of transmon qubits. Such defects could include e.g. defects in the crystal structure of the substrate or defects in a form of polar impurities such as hydroxyl (OH—) groups.

Another issue unique to quantum circuits is the use of superconducting materials. As described above, Josephson Junctions fabricated the double-angle shadow evaporation approach can only use Al as the superconductor for the base and the top electrodes. This limitation is another example of problems with the fabrication approach described above because interconnects in quantum circuits are typically made from other superconducting materials such as e.g. Nb, TiN and NbTiN and interfaces between the different superconducting materials used for Josephson Junctions and interconnects present yet another source of losses. Any losses are especially significant in context of quantum circuits where, sometimes, energy as small as that of a single photon is to be transmitted, making loss tolerance very low.

Yet another problem with the fabrication approach described above is that metal evaporation and formation of the tunnel barrier by oxidation of the base superconductor often leads to variations in thicknesses of base electrodes, tunnel barriers, and top electrodes of Josephson Junctions. In addition, concentration of trap states (i.e. spurious TLS's) in the oxide layer is uncontrolled. These variations lead to variation in performance and/or control of the resulting Josephson Junctions.

FIGS. 5A-5G provide a schematic illustration of Damascene fabrication of Josephson Junctions, according to some embodiments of the present disclosure. The fabrication process described below improves on some of the challenges of the existing fabrication approaches described above. For one, the Damascene fabrication process described herein is manufacturable. In addition, employing such fabrication process allows encapsulating some of the defects in areas that are further from Josephson Junctions compared to Junctions fabricated using the double-angle shadow evaporation approach, thus reducing the amount of spurious TLS's in the vicinity of Josephson Junctions. Still further, using the Damascene fabrication process as described herein advantageously extends the arsenal of superconducting materials that may be employed as base and top electrodes of Josephson Junctions to include those besides Al.

Similar to FIGS. 4A-4C, each of FIGS. 5A-5G illustrates a result of different subsequent fabrication steps by providing a cross-sectional view with a cross-section of the structure of these figures taken as described above with reference to the view shown on the left side of FIGS. 4A-4). FIGS. 5A-5G will now be described with reference to FIG. 6 providing a flow chart of a method 600 for Damascene fabrication of Josephson Junctions, according to some embodiments of the present disclosure, which method could be used for fabricating the structures of FIGS. 5A-5G.

The method may begin with providing a patterned superconducting (SC) layer 518 over a substrate 502 (box 602 in FIG. 6), as shown in FIG. 5A. Portions of the patterned superconductor layer 518 may later be used for e.g. resonators. Examples of superconducting materials that may be used as the SC layer 518 include, but are not limited to aluminum (Al), niobium (Nb), niobum nitride (NbN), niobium titanium nitride (NbTiN), titanium nitride (TiN), molybdenum rhenium (MoRe), etc., or any alloy of two or more superconducting materials.

In various embodiments, any kind of photoresist patterning techniques as known in the art may be used for creating the patterned SC layer 518 as shown in FIG. 5A. For example, in an embodiment, patterning includes depositing a layer of photoresist over the substrate 502. The photoresist may be a positive or negative resist and may include for example, poly(methyl methacrylate), poly(methyl glutarimide), DNQ/novolac, or SU-8 (an epoxy based negative resist). The photoresist may be deposited by a casting process such as, for example, spin-coating. Spin coating may be performed at 1 to 10,000 rpm, including all values and ranges therein, for a time period in the range of 1 second to 10 seconds, including all values and ranges therein.

The photoresist may then be patterned by optically projecting an image of a desired pattern onto the photoresist using photolithography, such as optical photolithography, immersion photolithography, deep UV lithography, extreme UV lithography, or other techniques, wherein the wavelength of projected light may be up to 436 nm, including all values and ranges from 157 nm to 436 nm, such as 157 nm, 193 nm, 248 nm, etc. A developer, such as tetramethylammonium hydroxide TMAH (with or without surfactant) at a concentration of in the range of 0.1 N to 0.3 N, may be applied to the photoresist, such as by spin-coating, and portions of the photoresist are removed to expose regions of the underlying substrate 502 correlating to the desired pattern.

In some embodiments, baking of the substrate 502 may occur before or after any of the above actions. For example, the substrate 502 may be prebaked to remove surface water. In some embodiments, prebaking may be performed at a temperature in the range of 200° C. to 400° C., including all values and ranges therein, for a time of 30 to 60 minutes, including all values and ranges therein. After application of the photoresist, a post application bake may occur, wherein at least a portion of the solvents in the photoresist are driven off. A post application bake is, for example, performed at temperatures in the range of 70° C. to 140° C., including all values and ranges therein, for a time period in the range of 60 seconds to 240 seconds, including all values and ranges therein. After patterning, the resist may be hard baked at a temperature in the range of 100° C. to 300° C., including all values and ranges therein, for a time period of 1 minute to 10 minutes, including all values and ranges therein.

After patterning the photoresist layer, one or more superconducting materials of the SC layer 518 may be deposited through the patterned photoresist, i.e. the superconducting materials will be deposited in the openings of the patterned photoresist, isolating a portion of the SC layer 518 in one opening from portions in other openings that may be formed in the photoresist both physically and electrically. The cross-section shown in FIG. 5A illustrates 3 such portions of the patterned SC layer 518. Of course, in other embodiments, any other number of portions and any suitable patterns of the SC layer may be used.

In some embodiments, deposition of the one or more superconducting materials of the SC layer 518 may be performed using a conformal coating process, wherein the superconducting material is deposited on any exposed surface of the patterned photoresist layer, including on the sidewalls and bottom of any opening formed in the patterned photoresist layer. A conformal coating may, therefore, be understood as a coating that is applied to exposed surfaces of the patterned photoresist layer, and not, for example, just to horizontal surfaces. In some embodiments, the coating may exhibit a variation in thickness of less than 35%, including all values and ranges from 1% to 35%, such as 10% or less, 15% or less, 20% of less, 25% or less, etc. The conformal coating process may be selected from processes such as chemical vapor deposition or atomic layer deposition. Other processes that may be used include physical vapor deposition such as, magnetron sputtering, evaporative deposition or e-beam deposition.

In chemical vapor deposition, for example, one or more reactive gases are provided in a chamber including the patterned photoresist layer at a flow rate of 5 sccm to 500 sccm, including all values and ranges therein. In some examples, the reactive gas may be selected from one or more of the following: pentakis(dimethylamino)tantalum, tris(diethylamido)(tert-butylimido)tantalum(V), tris(ethylmethylamido)(tert-butylimido)tantalum(V), or titanium tetrachloride and ammonia provided at a 1:1 stoichiometric ratio. The reactive gas may be provided with a carrier gas, such as an inert gas, which may include, for example, argon.

In some embodiments, the chamber may be maintained at a pressure in the range of 1 mTorr to 100 mTorr, including all values and ranges therein, and a temperature in the range of 100° C. to 500° C., including all values and ranges therein. In some embodiments, the process may be plasma assisted where electrodes are provided within the process chamber and are used to ionize the gases. Alternatively, plasma may be formed outside of the chamber and then supplied into the chamber. In the chamber, a layer of the metal is deposited on the surface of the patterned photoresist layer due to reaction of the gas.

In physical vapor deposition, a workpiece (i.e. the substrate with the patterned photoresist layer) is placed in a process chamber. A reactive gas, such nitrogen, is supplied to the process chamber at a flow rate in the range of 10 sccm to 100 sccm, including all values and ranges therein such as 40 sccm to 50 sccm or 45 sccm. An inert gas, such as argon, may optionally be supplied into the process chamber as well. Prior to supplying the reactive gas, the base pressure of the process chamber may be in the range of $10^{-8}$ torr and held at a pressure in the range of $10^{-7}$ to $10^{-1}$ torr during sputtering, such as in the range of 1 millitorr to 10 millitorr, or 2.5 millitorr. The process chamber may be maintained at a temperature in the range of 10° C. to 100° C., including all values and ranges therein, such as in the range of 10° C. to 20° C. or 17° C.

A metal target may be positioned in the process chamber and formed of a suitable superconducting metal. The metal target may be biased by a DC sources rated in the range of −50 V to −1000 V, including all values and ranges therein. The workpiece, or worktable, may also be biased by an AC source rated in the range of −50 V to −100 V including all values and ranges therein, such as −70 to −80 V.

During deposition, a plasma forms and is localized around the target due to magnets positioned proximal to or behind the target. The plasma bombards the target sputtering away the metal atoms as a vapor, which is then deposited on the workpiece. The process may continue for a time period in the range of 1 second to 100 seconds.

Once the SC material 518 has been patterned, then the remaining photoresist may be removed via a process such as ashing, wherein the photoresist is exposed to oxygen or fluorine, which combines with the photoresist to form ash.

Once the patterned SC layer 518 is formed, dielectric 520 is deposited over the patterned SC layer (box 604 in FIG. 6), as shown in FIG. 5B. Since this dielectric surrounds the patterns of the SC layer it is referred to herein as a "surrounding dielectric" in order to differentiate it from the dielectric/insulating material forming the tunnel barrier of the Josephson Junction formed by the method 600.

Since the surrounding dielectric 520 will need to later be etched to form a via opening, etching properties of potential candidate materials are to be considered when selecting a suitable material to be used as the surrounding dielectric 520. Besides appropriate etching characteristics, some other considerations in selecting a suitable material may include e.g. possibilities of smooth film formation, low shrinkage and outgassing, and good dielectric properties (such as e.g. low electrical leakage, suitable value of a dielectric constant, and thermal stability). Examples of dielectric materials that may be used as the surrounding dielectric 520 include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

In some embodiments, the surrounding dielectric 520 may be provided as an oxide deposited over the pattered SC layer 518 using e.g. chemical vapor deposition, spin-on, or atomic layer deposition techniques as known in the art. In some embodiments, the surrounding dielectric 520 may include a dielectric material formed over the pattered SC layer 518 using coating techniques involving cross-linking of liquid precursors into solid dielectric materials.

Figure 6:
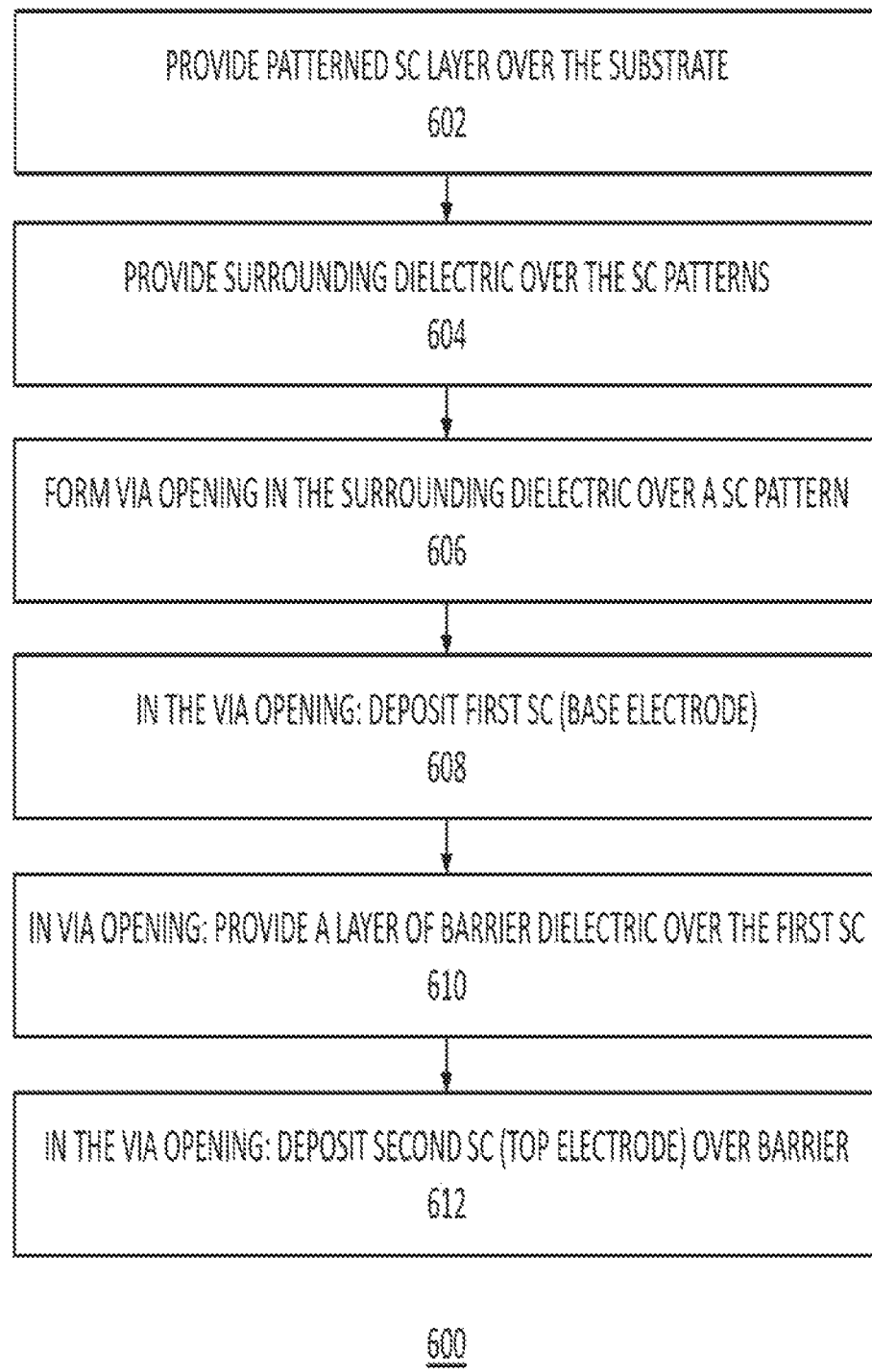
FIG. 6 provides a flow chart of a method for Damascene fabrication of Josephson Junctions, according to some embodiments of the present disclosure.

Next, the surrounding dielectric 520 is etched to form at least one via opening 522, as shown in FIG. 5C, defining a location of the future Josephson Junction (box 606 in FIG. 6). To that end, a patterning technique such as e.g. described above may be used in order to define location of the via opening in the surrounding dielectric layer 520. In particular, the via opening is to be formed over one portion of the patterned SC layer 518 (in FIG. 5C—over the middle portion out of the three portions of the patterned SC layer 518 shown in the figure), with the via opening extending all the way to and exposing the patterned SC layer 518.

Once an appropriate photoresist mask has been provided as described above, defining the location of the via opening 522 by exposing a portion of the surrounding dielectric 520 where the via opening should begin, the exposed portion of the surrounding dielectric 520 is then chemically etched, where the exposed portions of the surface are removed until a desired depth is achieved, forming an opening (or multiple such openings) in the surrounding dielectric 520. In this manner, a via opening may be formed that is e.g. about 20 nm in the dimensions in the x-y plane shown in FIGS. 5A-5G and 50 nm or greater, possibly much greater, in the dimension in the z-axis. In principle, any dimensions are possible and are within the scope of the present disclosure. The remaining photoresist may then be removed, e.g. using the ashing process as described above.

Next, a Josephson Junction is formed within the via opening by depositing, within the via opening, a first superconductor 510 forming the base layer of the Josephson Junction (box 608), followed by depositing a barrier dielectric 524 forming the tunnel barrier of the Josepshson Junction (box 610), and concluding with depositing a second superconductor 512 forming the top layer of the Josephson Junction (box 612). The result is shown in FIG. 5D.

Any deposition methods for depositing the first superconductor 510, the barrier dielectric 524, and the second superconductor 512 may be employed. For example, CVD, PVD, or ALD may be used to deposit each of these materials. In some embodiments, one or more of the first superconductor 510, the barrier dielectric 524, and the second superconductor 512 may be deposited by atomic level growth, e.g. using epitaxial growth, from gaseous or liquid precursors.

Inventors of the present disclosure have recognized that double-angle shadow evaporation approach may lead to variations in thicknesses of the superconducting and dielectric layers of the resulting Josepshon Junctions, as previously described herein. Employing atomic level growth to form these layers in Josephson Junctions advantageously allows providing controlled layers (e.g. with tightly controlled thicknesses) of specific materials that do not intermix.

Another advantage of atomic level growth is that it allows forming Josephson Junctions using refractory metals as base and top electrodes. Examples of such materials include TiN and NbTiN.

In general, any suitable superconducting materials that may be grown using atomic level growth, such as e.g. Nb, NbN, NbTiN, TiN, MoRe, may be used for base and/or top electrodes of the Damascene fabrication of the method 600. One advantage of having an increased arsenal of superconducting materials to choose from for the base and top electrodes of a Josephson Junction is that it give the possibility to form electrodes of Josephson Junctions from the same material as one or more interconnects providing electrical connections to these electrodes. This was not possible before when the double-angle shadow evaporation method of forming Josephson Junctions was used because only Al could be deposited using that method.

Yet another advantage of atomic level growth is that forming the barrier dielectric in this manner provides an improved control over trap states and thus, reducing the total amount of spurious TLS's present in a Josephson Junction and improving on the problem of qubits' decoherence. Dielectric materials that may be grown either by chemical vapor deposition (CVD) or by atomic layer deposition (ALD) in the method of FIG. 6 include e.g. SiN or $SiO_x$-$C_yN_z$, where x, y, z can take on different values. Thickness of the dielectric tunnel barrier may be between e.g. 1 and 5 nm, typically for qubit applications between 2 and 3 nm.

The Damascene fabrication process as described above also provides another measure for improving on the problem of qubits' decoherence: the first superconductor 510 may be grown very thin, less than 5 nm thick, preferably between 2 and 3 nm thick, providing a fresh in-situ surface for the Josephson Junction and encapsulating any defects between the patterned SC layer 518 and the base electrode superconductors. Thickness of the top electrode may be between e.g. 10 and 300 nm, e.g. between 40 and 100 nm.

Following deposition of the top electrode, the wafer may be polished down to the surface of the surrounding dielectric 518 (not shown in FIG. 6) to provide a flat surface as shown in FIG. 5E showing that a top surface 526 of the top electrode of the Josephson Junction 514 is aligned with a top surface 528 of the surrounding dielectric 518. In various embodiments, such polishing may be carried out using any of the known planarization techniques as known in the art, e.g. using either wet or dry planarization processes. In one embodiment, planarization is performed using chemical mechanical planarization (CMP), which may be understood as a process that utilizes a polishing surface, an abrasive and a slurry to remove the overburden and planarize the surface of the top electrode of the Josephson Junction 514 and the surrounding dielectric 518.

FIGS. 5F and 5G illustrate optional formation of an interconnect configured to provide electrical interconnection between the top electrode of the Josephson Junction 514 and a further component of the quantum circuit. Since these steps are performed after the Josephson Junction is formed, they are not shown in FIG. 6.

In embodiments where such an interconnect is desirable, the method may continue once the top surface of the top electrode of the Josephson Junction is planarized to be in line with the surrounding dielectric 518, as was shown in FIG. 5E. Next, a via opening 530 may be formed, as shown in FIG. 5F, for providing an electrical connection to a certain quantum circuit component, such as e.g. a SQUID loop or a capacitor in case the qubit is a transmon. The via opening 530 may be formed using patterning and etching techniques similar to those described above for the formation of the via opening 522. A superconducting material, referred to herein as a "wireup superconductor" 532 may then be deposited and patterned to the desired shape and form, as shown in FIG. 5G. To that end, deposition and patterning techniques similar to those described above may be used. In various embodiments, the wireup superconductor 532 may be formed from any of the superconducting materials described above. Such a wireup superconductor 532 forms one of the interconnects of the quantum circuit by providing electrical interconnection between the top electrode and a further component of the quantum circuit.

FIGS. 7A and 7B provide schematic illustrations of cross-sections of, respectively, a structure 700A comprising a Josephson Junction formed using double-angle shadow evaporation approach and a structure 700B comprising a Josephson Junction formed using Damascene fabrication approach according to some embodiments of the present disclosure. Reference numerals in FIGS. 7A and 7B similar to those used in FIGS. 4A-4C, and FIGS. 5A-5G, except with the letters A or B to differentiate between FIG. 7A and FIG. 7B, are used to illustrate analogous elements in the figures. For example, reference numerals 702A and 702B shown in FIGS. 7A and 7B respectively refer to a substrate, reference numerals 710A and 710B—to the first superconductor, reference numerals 722A and 722B—to the dielectric material for the tunnel barrier, and so on.

As can be seen, FIGS. 7A and 7B are drawn to reflect example real world process limitations, in that the features are not drawn with precise right angles and straight lines. As shown, FIGS. 7A and 7B represent cross-section view similar to that shown in FIGS. 4C (left side) and 5E, respectively. FIGS. 7A and 7B illustrate a substrate 702, a base electrode 710, a tunnel barrier layer 722, and a top electrode 712 of the Josephson Junction. In addition, FIG. 7B illustrates the patterned superconductor layer 718 and a surrounding dielectric 720. The features shown in FIGS. 7A and 7B would be visible in e.g. a scanning electron microscopy (SEM) images of structures comprising Josephson Junctions. Comparison of the cross-sections 700A and 700B illustrates variations in surface roughness (i.e. variations in thickness) of materials forming the base and top electrodes and the dielectric of the Josephson Junction—due to atomic level deposition techniques that may be used in the Damascene process described herein, the surface roughness is greatly reduced as shown in FIG. 7B. In addition, comparison of the of the of the cross-sections 700A and 700B illustrates that it is immediately visible that the base electrode 710B is much thinner than the base electrode 710A, that the top electrode 712B is provided only over the tunnel barrier dielectric 722B and not overflowing on the sides as in FIG. 7A, and that, due to polishing, the top surface of the top electrode 712B is nicely aligned with the top surface of the surrounding dielectric 720B.

Some Examples in accordance with various embodiments of the present disclosure are now described.

Example 1 provides a superconducting qubit for a quantum circuit provided over a substrate. The superconducting qubit includes a Josephson Junction provided over the substrate, the Josephson Junction including a base electrode layer, a top electrode layer, and a tunnel barrier layer provided between the base electrode layer and the top electrode layer, where a thickness of the base electrode layer is less than 10 nm.

Example 2 provides the superconducting qubit according to Example 2, where the thickness of the base electrode layer is less than 5 nm, e.g. between 2 and 4 nm.

Example 3 provides the superconducting qubit according to Examples 1 or 2, where the Josephson Junction is provided in a via opening provided over the substrate, and the via opening is surrounded by a dielectric.

Example 4 provides the superconducting qubit according to Example 3, where an upper surface of the dielectric is aligned with an upper surface of the top electrode layer.

Example 5 provides the superconducting qubit according to Examples 3 or 4, where the via opening is substantially perpendicular to the substrate.

Example 6 provides the superconducting qubit according to any one of the preceding Examples, where the base electrode layer is provided on a patterned superconductor layer provided over the substrate, and where dimensions of the base electrode layer in a plane of the base electrode layer and the patterned superconductor layer are smaller than dimensions of the patterned superconductor layer.

Example 7 provides the superconducting qubit according to any one of the preceding Examples, further including an interconnect configured to provide electrical interconnection between the top electrode and a further component of the quantum circuit.

Example 8 provides the superconducting qubit according to Example 7, where the interconnect includes a first portion provided in a plane substantially parallel to a plane of the substrate, and where a part of the first portion is in contact with the top electrode.

Example 9 provides the superconducting qubit according to Examples 7 or 8, where the further component of the quantum circuit includes a SQUID loop.

Example 10 provides the superconducting qubit according to Examples 7 or 8, where the further component of the quantum circuit includes a capacitor of the superconducting qubit.

Example 11 provides the superconducting qubit according to any one of the preceding Examples, where the superconducting qubit is a charge qubit.

Example 12 provides the superconducting qubit according to any one of the preceding Examples, where the superconducting qubit is a transmon.

Example 13 provides the superconducting qubit according to any one of Examples 1-9, where the superconducting qubit is a flux qubit.

Example 14 provides a quantum integrated circuit package, including a substrate; and a first superconducting qubit and a second superconducting qubit provided over the substrate, where each of the first superconducting qubit and the a second superconducting qubit includes a Josephson Junction including a base electrode layer, a top electrode layer, and a tunnel barrier layer provided between the base electrode layer and the top electrode layer, where a thickness of the base electrode layer is less than 5 nanometers (nm).

In a further example, any of the first and the second superconducting qubits could be a superconducting qubit according to any one of the Examples above.

Example 15 provides the quantum integrated circuit package according to Example 14, where the first superconducting qubit and the second superconducting qubit are coupled by a coupling resonator.

Example 16 provides a quantum computing device, including one or more integrated circuit packages according to Examples 14 or 15.

In a further example, the quantum computing device may include superconducting qubits according to any one of the Examples above.

Example 17 provides the quantum computing device according to Example 16, further including a cryogenic apparatus configured to maintain the first superconducting qubit and the second superconducting qubit at a cryogenic temperature during operation of the first superconducting qubit and the second superconducting qubit.

Example 18 provides a method for fabricating at least a Josephson Junction of a superconducting qubit, the method including providing a patterned superconductor layer over a substrate; providing a layer of surrounding dielectric over the patterned superconductor layer; providing a via opening in the layer of surrounding dielectric over a first portion of the patterned superconductor layer; depositing a first layer of superconductor in the via opening to form a base electrode of the Josephson Junction; providing a layer of barrier dielectric in the via opening, on the first layer of superconductor in the via opening, to form a tunnel barrier layer of the Josephson Junction; and depositing a second layer of superconductor in the via opening, on the layer of barrier dielectric in the via opening, to form a top electrode of the Josephson Junction.

Example 19 provides the method according to Example 18, where a thickness of the first layer of superconductor is less than 5 nanometers (nm).

Example 20 provides the method according to Examples 18 or 19, further including polishing the second layer of superconductor until an upper surface of the second layer of superconductor is aligned with an upper surface of the layer of surrounding dielectric.

Example 21 provides the method according to any one of Examples 18-20, further including providing a further via opening in the layer of surrounding dielectric over a second portion of the patterned superconductor layer, the second portion being electrically disconnected from the first portion; and depositing a wireup superconductor in the further via opening and over the second layer of superconductor in the via opening.

Example 22 provides the method according to Example 21, patterning the wireup superconductor to form an interconnect configured to provide electrical interconnection between the top electrode and the second portion of the patterned superconductor layer.

Example 23 provides the method according to Example 22, where the second portion of the patterned superconductor layer includes or is electrically connected to a further component of the quantum circuit.

Example 24 provides the method according to Example 23, where the further component of the quantum circuit includes a SQUID loop.

Example 25 provides the method according to Example 23, where the further component of the quantum circuit includes a capacitor of the superconducting qubit.

Example 26 provides the method according to any one of Examples 21-25, where the further via opening is provided after the top electrode of the Josephson Junction is formed.

Example 27 provides the method according to any one of Examples 18-26, where depositing the first layer of superconductor and/or the first layer of superconductor includes deposition by atomic level growth.

Example 28 provides the method according to any one of Examples 18-27, where providing the layer of barrier dielectric includes depositing the layer of barrier dielectric by atomic level growth.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A superconducting qubit for a quantum circuit provided over a substrate, the superconducting qubit comprising:
   a Josephson Junction provided over the substrate, the Josephson Junction comprising a base electrode layer, a top electrode layer, and a tunnel barrier layer provided between the base electrode layer and the top electrode layer, wherein the Josephson Junction is provided in a via opening provided over the substrate, and the via opening is surrounded by a dielectric.

2. The superconducting qubit according to claim 1, wherein the thickness of the base electrode layer is less than 5 nm.

3. The superconducting qubit according to claim 1, wherein an upper surface of the dielectric is aligned with an upper surface of the top electrode layer.

4. The superconducting qubit according to claim 1, wherein the via opening is substantially perpendicular to the substrate.

5. The superconducting qubit according to claim 1, wherein the base electrode layer is provided on a patterned superconductor layer provided over the substrate, and wherein dimensions of the base electrode layer in a plane of the base electrode layer and the patterned superconductor layer are smaller than dimensions of the patterned superconductor layer.

6. The superconducting qubit according to claim 1, further comprising an interconnect configured to provide electrical interconnection between the top electrode layer and a further component of the quantum circuit.

7. The superconducting qubit according to claim 6, wherein the interconnect comprises a first portion provided in a plane substantially parallel to a plane of the substrate, and wherein a part of the first portion is in contact with the top electrode layer.

8. The superconducting qubit according to claim 6, wherein the further component of the quantum circuit comprises a SQUID loop.

9. The superconducting qubit according to claim 6, wherein the further component of the quantum circuit comprises a capacitor of the superconducting qubit.

10. The superconducting qubit according to claim 1, wherein the superconducting qubit is a charge qubit.

11. The superconducting qubit according to claim 1, wherein the superconducting qubit is a transmon.

12. The superconducting qubit according to claim 1, wherein the superconducting qubit is a flux qubit.

13. A quantum integrated circuit package, comprising:
   a substrate; and
   a first superconducting qubit and a second superconducting qubit provided over the substrate,
   wherein each of the first superconducting qubit and the second superconducting qubit comprises a Josephson Junction comprising a base electrode layer, a top electrode layer, and a tunnel barrier layer provided between the base electrode layer and the top electrode layer, wherein the Josephson Junction is provided in a via opening provided over the substrate, and the via opening is surrounded by a dielectric.

14. The quantum integrated circuit package according to claim 13, wherein the first superconducting qubit and the second superconducting qubit are coupled by a coupling resonator.

15. A quantum computing device, comprising:
   a package substrate; and
   a first superconducting qubit and a second superconducting qubit provided over the package substrate,
   wherein each of the first superconducting qubit and the second superconducting qubit comprises a Josephson Junction comprising a base electrode layer, a top electrode layer, and a tunnel barrier layer provided between the base electrode layer and the top electrode layer, wherein the Josephson Junction is provided in a via opening provided over the substrate, and the via opening is surrounded by a dielectric.

16. The quantum computing device according to claim 15, further comprising a cryogenic apparatus configured to maintain the first superconducting qubit and the second superconducting qubit at a cryogenic temperature during operation of the first superconducting qubit and the second superconducting qubit.

* * * * *

UNITED STATES PATENT AND TRADEMARK OFFICE
CERTIFICATE OF CORRECTION

PATENT NO. : 10,763,420 B2
APPLICATION NO. : 16/301498
DATED : September 1, 2020
INVENTOR(S) : Zachary R. Yoscovits et al.

It is certified that error appears in the above-identified patent and that said Letters Patent is hereby corrected as shown below:

In the Specification

Column 1, Line 3 (approx.), Below "FABRICATION" insert:
-- CROSS-REFERENCE TO RELATED APPLICATION
This application is a national stage application under 35 U.S.C. § 371 of PCT International Application Serial. No. PCT/US2016/037134, filed on Jun. 13, 2016, and entitled "JOSEPHSON JUNCTION DAMASCENE FABRICATION," which is hereby incorporated by reference in its entirety. --.

Signed and Sealed this
Twenty-fourth Day of November, 2020

Andrei Iancu
*Director of the United States Patent and Trademark Office*